(12) United States Patent
Kim et al.

(10) Patent No.: US 11,355,377 B2
(45) Date of Patent: Jun. 7, 2022

(54) ELECTROSTATIC CHUCK

(71) Applicant: KSM COMPONENT CO., LTD., Gimpo-si (KR)

(72) Inventors: Yun Ho Kim, Seoul (KR); Joo Hwan Kim, Seoul (KR)

(73) Assignee: KSM COMPONENT CO., LTD., Gimpo-si (KR)

( * ) Notice: Subject to any disclaimer, the term of this patent is extended or adjusted under 35 U.S.C. 154(b) by 185 days.

(21) Appl. No.: 16/629,709

(22) PCT Filed: May 15, 2018

(86) PCT No.: PCT/KR2018/005548
§ 371 (c)(1),
(2) Date: Jan. 9, 2020

(87) PCT Pub. No.: WO2019/013442
PCT Pub. Date: Jan. 17, 2019

(65) Prior Publication Data
US 2020/0219747 A1    Jul. 9, 2020

(30) Foreign Application Priority Data

Jul. 10, 2017    (KR) .................. 10-2017-0087279

(51) Int. Cl.
*H01L 21/683*    (2006.01)
*C04B 35/581*    (2006.01)
(Continued)

(52) U.S. Cl.
CPC ........ *H01L 21/6833* (2013.01); *C04B 35/581* (2013.01); *C04B 35/6261* (2013.01);
(Continued)

(58) Field of Classification Search
CPC ............... H01L 21/6833; C04B 35/581; C04B 35/6261; C04B 35/6264; C04B 35/62655;
(Continued)

(56) References Cited

U.S. PATENT DOCUMENTS

2002/0110709 A1    8/2002  Katsuda et al.
2004/0096706 A1    5/2004  Teratani et al.
(Continued)

FOREIGN PATENT DOCUMENTS

CN    104926314 A    9/2015
JP    62-17075 A    1/1987
(Continued)

OTHER PUBLICATIONS

International Search Report for PCT/KR2018/005548 dated Aug. 24, 2018 (PCT/ISA/210).

*Primary Examiner* — Karl E Group
*Assistant Examiner* — Cameron K Miller
(74) *Attorney, Agent, or Firm* — Sughrue Mion, PLLC

(57) ABSTRACT

One embodiment of the present invention discloses an electrostatic chuck made of an aluminum nitride sintered body, wherein the aluminum nitride sintered body comprises aluminum nitride and a composite oxide formed along the grain boundaries of the aluminum nitride, wherein the composite oxide comprises at least two kinds of rare earth metals which have a solid-solution relationship with each
(Continued)

other, and wherein the composite oxide comprises a collection area having a higher oxygen content than a surrounding area.

8 Claims, 5 Drawing Sheets

(51) Int. Cl.
    *C04B 35/645*     (2006.01)
    *C04B 35/626*     (2006.01)

(52) U.S. Cl.
    CPC .... *C04B 35/6264* (2013.01); *C04B 35/62655* (2013.01); *C04B 35/645* (2013.01); *C04B 2235/3224* (2013.01); *C04B 2235/3229* (2013.01); *C04B 2235/3865* (2013.01); *C04B 2235/3886* (2013.01); *C04B 2235/604* (2013.01); *C04B 2235/606* (2013.01); *C04B 2235/656* (2013.01); *C04B 2235/87* (2013.01)

(58) Field of Classification Search
    CPC .......... C04B 35/645; C04B 2235/3224; C04B 2235/3229; C04B 2235/3865; C04B 2235/3886; C04B 2235/604; C04B 2235/606; C04B 2235/656; C04B 2235/87

See application file for complete search history.

(56) References Cited

U.S. PATENT DOCUMENTS

| | | |
|---|---|---|
| 2004/0171474 A1 | 9/2004 | Kobayashi et al. |
| 2005/0092789 A1 | 5/2005 | Giacona, III |
| 2007/0184966 A1 | 8/2007 | Gotoh et al. |
| 2007/0215840 A1* | 9/2007 | Yoshikawa ........... C04B 35/645 |
| | | 252/500 |
| 2010/0128409 A1 | 5/2010 | Teratani et al. |
| 2013/0285336 A1 | 10/2013 | Ito et al. |

FOREIGN PATENT DOCUMENTS

| | | |
|---|---|---|
| JP | 2002-324832 A | 11/2002 |
| JP | 2003-55052 A | 2/2003 |
| JP | 2004-83292 A | 3/2004 |
| JP | 2004-175656 A | 6/2004 |
| JP | 2004-262750 A | 9/2004 |
| JP | 2005-294648 A | 10/2005 |
| JP | 2006-273587 A | 10/2006 |
| JP | 2007-254164 A | 10/2007 |
| JP | 2013-241322 A | 12/2013 |
| KR | 10-2002-0031314 A | 5/2002 |
| KR | 10-1413250 B1 | 6/2014 |
| WO | 2005/092789 A1 | 10/2005 |

\* cited by examiner

[Fig. 1]
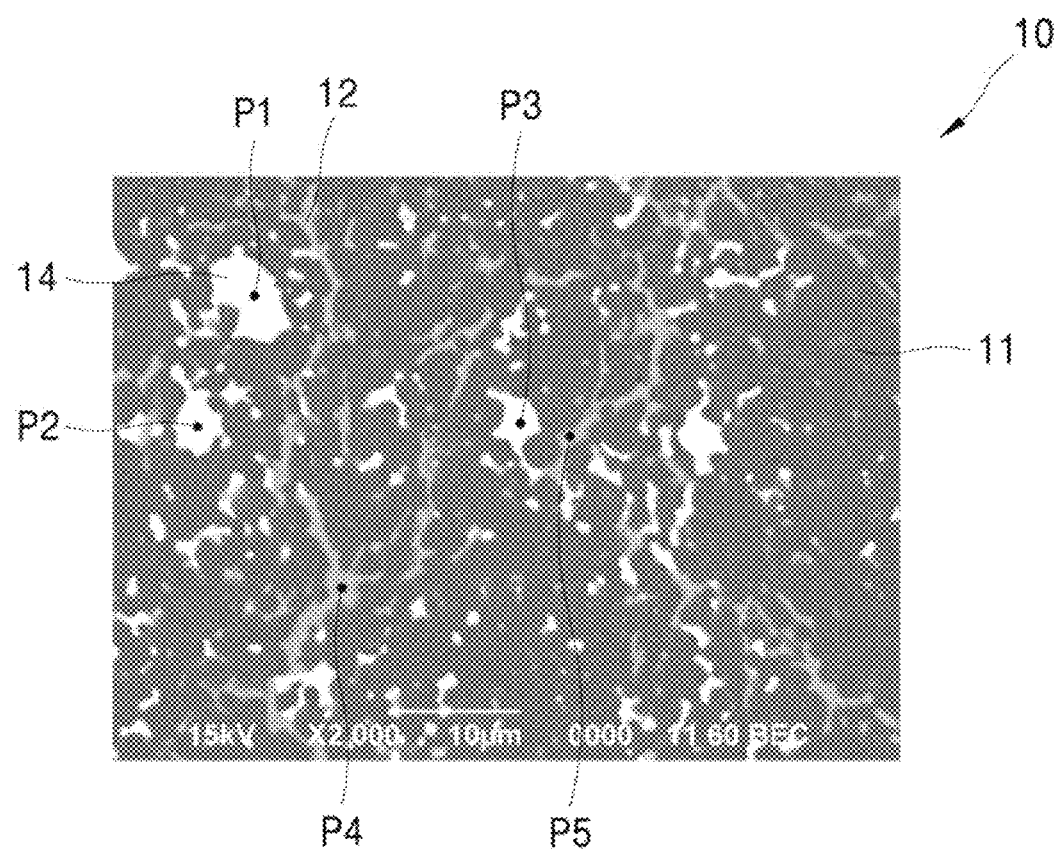

[Fig. 2]
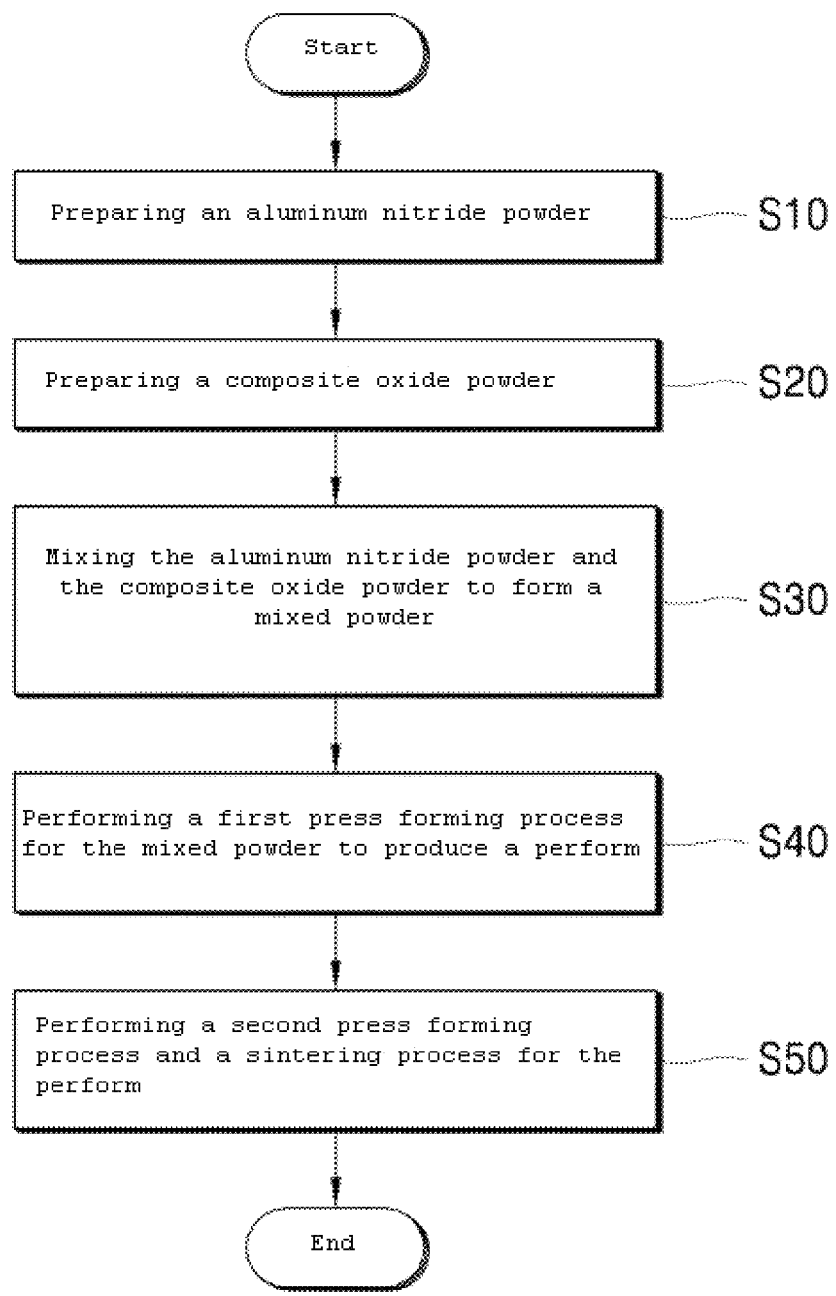

[Fig. 3]
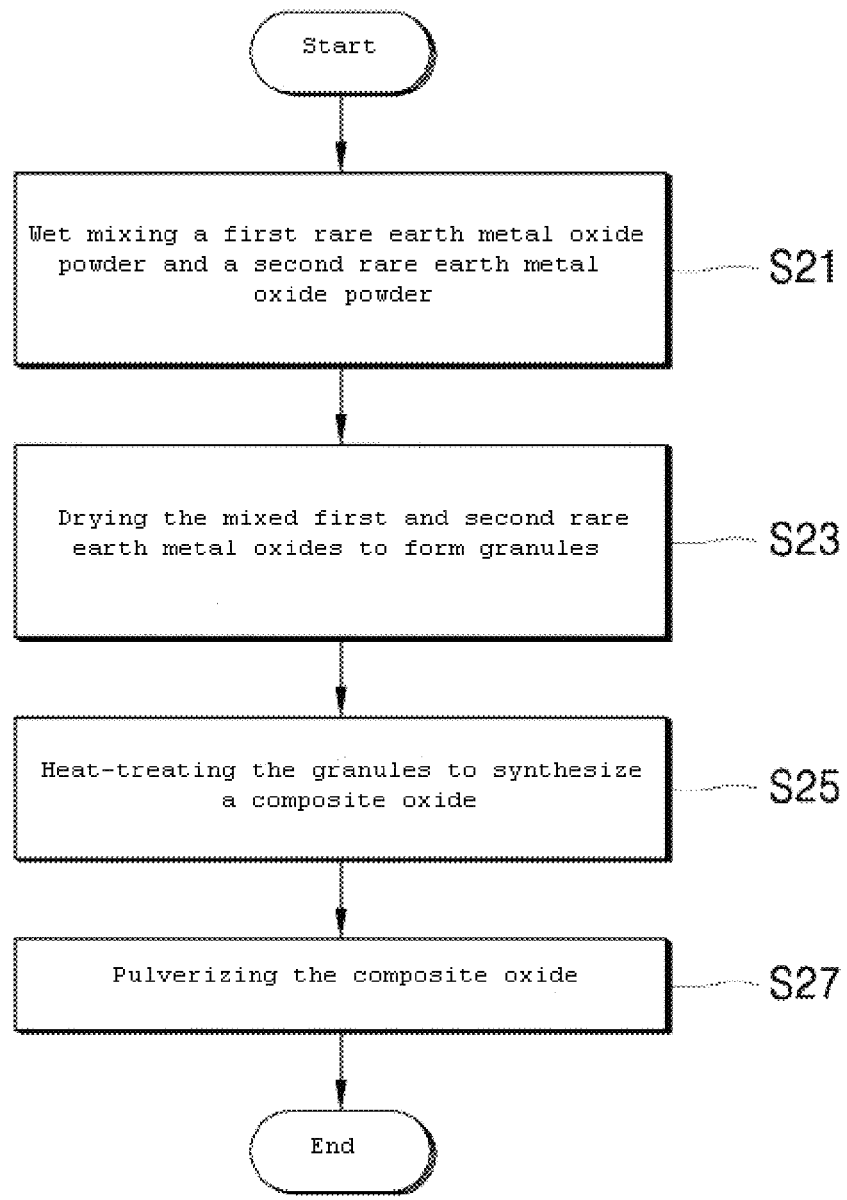

[Fig. 4]
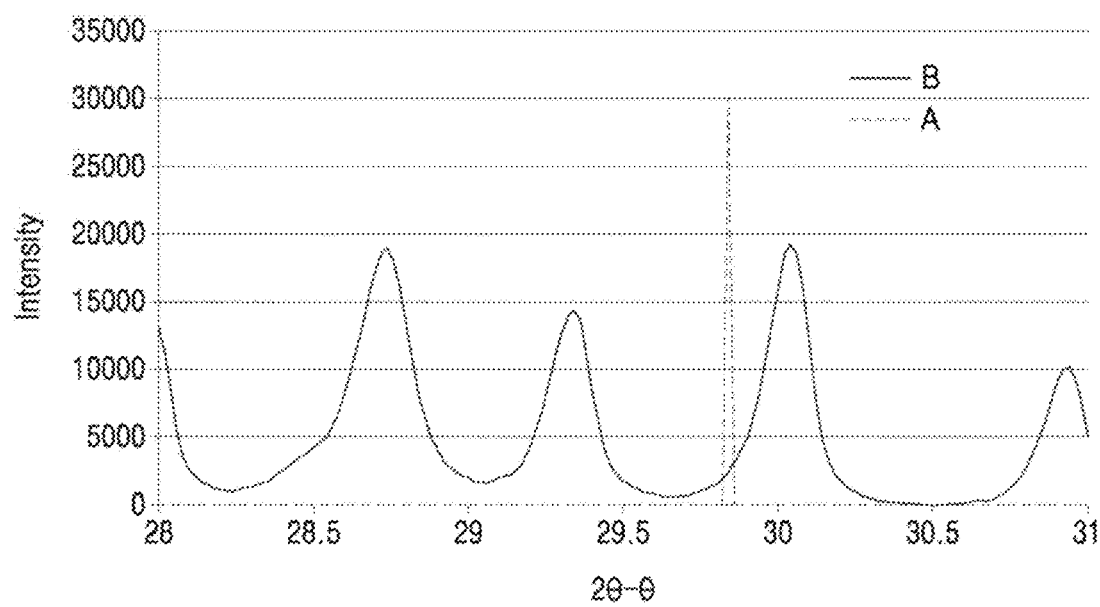
[Fig. 5]
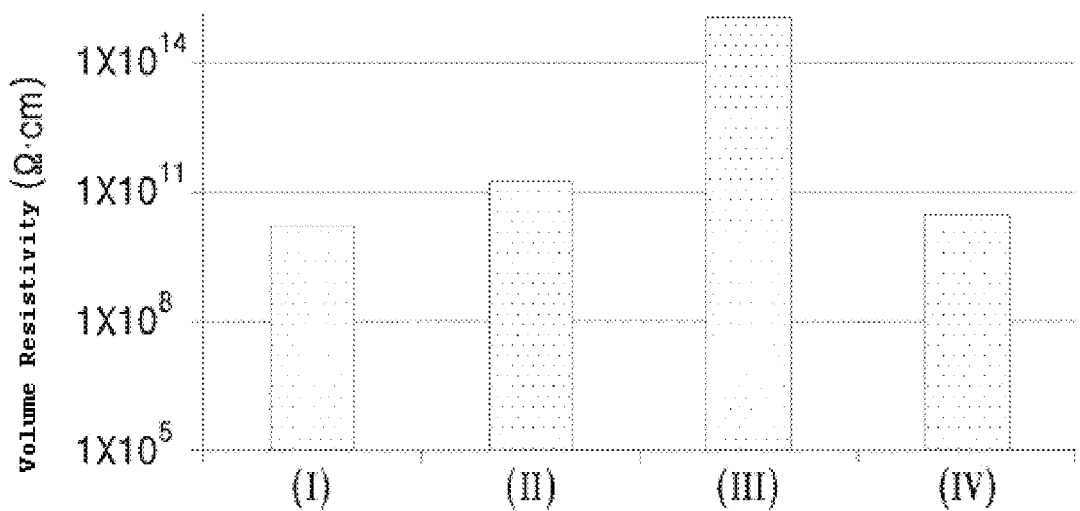

[Fig. 6]
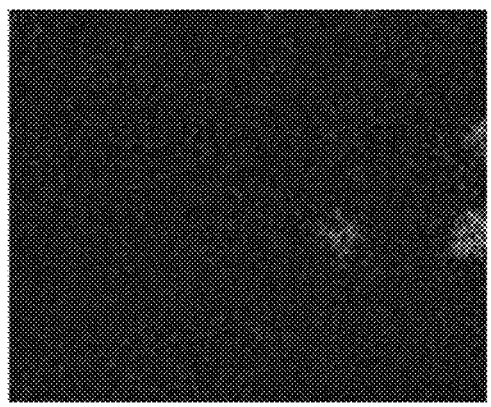 
(A) (B)

ELECTROSTATIC CHUCK

CROSS REFERENCE TO RELATED APPLICATIONS

This application is a National Stage of International Application No. PCT/KR2018/005548 filed May 15, 2018, claiming priority based on Japanese Patent Application No. 10-2017-0087279, filed Jul. 10, 2017.

TECHNICAL FIELD

The present invention relates to an electrostatic chuck.

BACKGROUND ART

An electrostatic chuck is an apparatus for fixing a semiconductor wafer or the like using an electrostatic force, and may be classified into a Coulomb type electrostatic chuck and a Johnson-Rahbek type electrostatic chuck according to an adsorption method.

The Coulomb type electrostatic chuck fixes a semiconductor wafer using an electrostatic attractive force between different charges present on the top and bottom faces of a dielectric. However, the Coulomb type electrostatic chuck should have a dielectric volume resistivity of $1\times10^{15}$ Ω·cm or more, and may not form a sufficient electrostatic adsorption force uniformly throughout the wafer contact surface as the size of a semiconductor wafer increases. In contrast, the Johnson-Rahbek type electrostatic chuck can provide a sufficient adsorption force even if a dielectric having a relatively low volume resistivity is used.

On the other hand, materials that use aluminum as the main material, such as aluminum nitride (AlN) are used as materials for the electrostatic chuck, and since a pure aluminum nitride (AlN) sintered body has a volume resistivity of $1\times10^{14}$ Ω·cm or more at room temperature, it may be difficult to have a sufficient adsorption rate and an excellent current response characteristics when used as a Johnsen-Rahbek type electrostatic chuck.

DISCLOSURE

Technical Problem

Embodiments of the present invention provide an electrostatic chuck having a reduced volume resistivity.

Technical Solution

An embodiment of the present invention discloses an electrostatic chuck made of an aluminum nitride sintered body, wherein the aluminum nitride sintered body comprises aluminum nitride and a composite oxide formed along the grain boundaries of the aluminum nitride, wherein the composite oxide comprises at least two kinds of rare earth metals which have a solid-solution relationship with each other, and wherein the composite oxide comprises a collection area having a higher oxygen content than a surrounding area.

In the present embodiment, the composite oxide may be included in the aluminum nitride sintered body at 0.2 wt % to 20 wt %.

In the present embodiment, the volume resistivity of the aluminum nitride sintered body may be $1\times10^{8}$ Ω·cm to $1\times10^{12}$ Ω·cm.

In the present embodiment, a crystal peak of the composite oxide may be different from crystal peaks of the oxides of each of the at least two kinds of rare earth metals.

In the present embodiment, the aluminum nitride sintered body may further comprise titanium nitride (TiN) at the grain boundaries of the aluminum nitride.

In the present embodiment, the titanium nitride (TiN) may be included in the aluminum nitride sintered body at 1 wt % to 5 wt %.

In the present embodiment, the at least two kinds of rare earth metals may be selected from lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

In the present embodiment, the composite oxide may comprise at least any one of a europium-gadolinium composite oxide (EuGdOX), a samarium-gadolinium composite oxide (SmGdOX), a cerium-europium composite oxide (CeEuOX), a samarium-cerium composite oxide (SmCeOX), a gadolinium-samarium composite oxide (GdSmOx), and a lanthanum-cerium composite oxide (LaCeOX).

In the present embodiment, the surrounding area may comprise an area excluding the collection area in the composite oxide and the aluminum nitride sintered body.

In the present embodiment, the composite oxide may be a nanocomposite oxide formed by a composite oxide powder having a nano size.

Other aspects, features, and advantages other than those described above will be apparent from the following drawings, claims, and detailed description of the invention.

Advantageous Effects

According to embodiments of the present invention, a volume resistivity of an electrostatic chuck may be reduced to improve a current response characteristic of the electrostatic chuck.

In addition, by manufacturing the electrostatic chuck using a composite oxide powder having a nano size, the sintering temperature may be lowered during the manufacturing process and the physical properties of the electrostatic chuck may be improved.

Of course, the scope of the present invention is not limited by these effects.

DESCRIPTION OF DRAWINGS

FIG. 1 is a photograph showing an aluminum nitride sintered body forming an electrostatic chuck according to an embodiment of the present invention.

FIG. 2 is a flowchart schematically showing a manufacturing process of an electrostatic chuck according to an embodiment of the present invention.

FIG. 3 is a flowchart schematically showing a manufacturing process of the composite oxide powder in the manufacturing process of the electrostatic chuck of FIG. 2.

FIG. 4 is a graph showing an XRD analysis result of the composite oxide powder of FIG. 1.

FIG. 5 is a histogram showing a sintering temperature and a volume resistivity of an aluminum nitride sintered body according to the size of the composite oxide powder of FIG. 1.

FIG. 6 is a photograph showing an oxygen distribution state of the aluminum nitride sintered body of FIG. 1.

BEST MODE

Since various modifications may be made to the present invention and the present invention may have various embodiments, specific embodiments will be illustrated in the drawings and described in detail in the detailed description. However, these not intended to limit the present invention to specific embodiments, it is to be understood that these include all modifications, equivalents, and substitutes included in the spirit and technical scope of the present invention. In describing the present invention, if it is determined that the specific description of the related known technologies may unnecessarily obscure the gist of the present invention, the detailed description for them will be omitted.

Terms such as a first and a second may be used to describe various components, but the components should not be limited by the terms. The terms are only used to distinguish one component from another component.

The terms used in the present application are for the purpose of describing specific embodiment only and are not intended to limit the present invention. Singular expressions include plural expressions unless the context clearly indicates otherwise. In addition, components in each drawing are exaggerated, omitted, or schematically illustrated for convenience and clarity of description, and the size of each component does not entirely reflect the actual size.

In the description of each component, when described as being formed on or under, both on and under encompass those formed either directly or through other components, and criteria for on and under will be described with reference to the drawings.

Hereinafter, embodiments of the present invention will be described in detail with reference to the appended drawings, and in the description with reference to the appended drawings, the same or corresponding components will be given the same reference numerals and duplicate description thereof will be omitted.

FIG. 1 is a photograph showing an aluminum nitride sintered body forming an electrostatic chuck according to an embodiment of the present invention.

The electrostatic chuck according to an embodiment of the present invention is a Johnson-Rahbek type electrostatic chuck, and at least a part thereof may be made of the aluminum nitride sintered body 10. By way of embodiment, the electrostatic chuck may be entirely made of aluminum nitride sintered body 10.

The aluminum nitride sintered body 10 may have aluminum nitride 11 as a main component and comprise a composite oxide 12 including a rare earth metal for improving conductivity of the sintered body of the aluminum nitride 11. In addition, the aluminum nitride sintered body 10 may further comprise titanium nitride (TiN).

The composite oxide 12 may be a composite oxide 12 including at least two kinds of rare earth metals. By way of embodiment, when the composite oxide 12 includes two kinds of rare earth metals, any one of the rare earth metals may be solid-solved in the other rare earth metal oxide. Thus, the crystal of any one of rare earth metal oxides is changed, so that the composite oxide 12 may have an increased lattice defect compared to a single rare earth metal oxide. That is, the composite oxide 12 comprising at least two kinds of rare earth metals according to the present invention is different from an oxide of any one of the two kinds of rare earth metals or a simple mixture of each oxide of the two kinds of rare earth metals.

On the other hand, since the composite oxide 12 having an increased lattice defect has improved the reactivity with oxygen, oxygen in the aluminum nitride 11 may be effectively removed. Therefore, since the purity of the aluminum nitride 11 is improved, the volume resistivity of the aluminum nitride sintered body 10 may be reduced.

The composite oxide 12 may be formed along the grain boundaries of the aluminum nitride 11. That is, since a continuous conductive crystal phase is generated along the grain boundaries of the aluminum nitride 11, the conductivity of the aluminum nitride sintered body 10 may be improved.

On the other hand, the composite oxide 12 may comprise a collection area 14 having the higher oxygen content than the surrounding area. Wherein, the surrounding area comprises an area excluding the collection area 14 in the composite oxide 12 and aluminum nitride 11.

Table 1 below shows the content of the composition at the first point P1 to the fifth point P5 in FIG. 1 when the aluminum nitride sintered body 11 in FIG. 1 comprises a samarium-cerium composite oxide (SmCeOX).

TABLE 1

| Element | P1 (Atomic %) | P2 (Atomic %) | P3 (Atomic %) | P4 (Atomic %) | P5 (Atomic %) |
|---|---|---|---|---|---|
| N | 10.57 | 0 | 17.57 | 30.47 | 13.81 |
| O | 60.68 | 65.12 | 52.95 | 38.91 | 50.90 |
| Al | 15.86 | 18.85 | 15.65 | 28.96 | 33.02 |
| Ce | 3.46 | 4.02 | 3.76 | 0.80 | 0.93 |
| Sm | 9.43 | 12.01 | 10.06 | 0.85 | 1.34 |

In FIG. 1, the first point P1, the second point P2, and the third point P3 are the collection areas 14, and the fourth point P4 and the fifth point P5 are conductive crystal phases formed by the composite oxide 12. As can be seen from Table 1 above, it can be seen that the oxygen content in the collection area 14 is much higher than the surrounding area of the collection area 14. The formation of the collection region 14 as described above may improve the conductivity of the aluminum nitride 11.

More specifically, as will be described below, the aluminum nitride sintered body 10 according to the present invention may be formed using a composite oxide powder having a nano size, whereby the aluminum nitride sintered body 10 may have a low volume resistivity even when sintered at a low sintering temperature. That is, since low-temperature liquid phase sintering is performed by the composite oxide powder having a nano size, the crystal size of the aluminum nitride 11 does not grow significantly unlike when sintered at a high temperature, and the liquid composite oxide penetrates through the particles of aluminum nitride 11 to densify the aluminum nitride sintered body 10, thereby forming a different microstructure from those formed by the existing high temperature sintering. This microstructure feature may be seen in the creation of the collection area 14. In other words, as the composite oxide 12 having excellent oxygen reactivity absorbs oxygen in and out of the particles of the aluminum nitride 11 while undergoing a low-temperature liquid phase sintering process, a microstructure including the collection area 14 is formed, and at the same time, oxygen defects are reduced, so that the particles of the aluminum nitride 11 are turned into excellent conductive particles. As a result, the aluminum nitride sintered body 10 may have a low electrostatic properties.

The at least two kinds of rare earth metals included in the composite oxide 12 may be selected from lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). By way of embodiment, the composite oxide 12 may comprise at least any one of a europium-gadolinium composite oxide (EuGdOX), a samarium-gadolinium composite oxide (SmGdOX), a cerium-europium composite oxide (CeEuOX), a samarium-cerium composite oxide (SmCeOX), a gadolinium-samarium composite oxide (GdSmOx), and a lanthanum-cerium composite oxide (LaCeOX). The composite oxide 12 is chemically bonded to the aluminum nitride 11 to form a conductive crystal phase along the grain boundaries of the aluminum nitride 11. By way of embodiment, when the composite oxide 12 is a samarium-cerium composite oxide (SmCeOX), the conductive crystal phase formed may be $Ce_{X1}$—$Sm_X AlO_3$.

The composite oxide 12 may be included at 0.2 wt % to 20 wt % based in the aluminum nitride sintered body 10 on the aluminum nitride sintered body 10. When the content of the composite oxide 12 is less than 0.2 wt % based on the aluminum nitride sintered body 10, the resistance-reducing effect of the aluminum nitride sintered body 10 is difficult to be obtained; and when the content of the composite oxide 12 is more than 20 wt % based on the aluminum nitride sintered body 10, the resistance of the aluminum nitride sintered body 10 is excessively reduced, so that leakage current of the electrostatic chuck may occur.

Therefore, the composite oxide 12 is preferably included in the aluminum nitride sintered body 10 at 0.2 wt % to 20 wt %, whereby the aluminum nitride sintered body 10 may have a volume resistivity of $1 \times 10^8$ Ω·cm to $1 \times 10^{12}$ Ω·cm, and the electrostatic chuck according to the present invention, which is able to be made of the aluminum nitride sintered body 10, may have a high adsorption force and an excellent current response characteristics in which the time of chucking upon application of voltage and de-chucking upon removal of voltage is within 5 seconds.

The aluminum nitride sintered body 10 may further comprise titanium nitride. As a result, since the aluminum nitride sintered body 10 has a black color, radiant heat flux can be increased and the heating properties can be improved. Therefore, the electrostatic chuck, which is able to be made of the aluminum nitride sintered body 10, may perform a function of heating the semiconductor wafer at the time of fixing the semiconductor wafer. In addition, since titanium nitride having a higher thermal and electrical conductivity than $TiO_2$ is included in the grain boundary of the aluminum nitride 11, the electrical characteristics of the composite oxide 12 may be improved.

Titanium nitride may be included in the aluminum nitride sintered body 10 at 1 wt % to 5 wt %. When the content of titanium nitride is less than 1 wt %, an additional resistance-reducing effect of the composite oxide 12 may be difficult to be obtained, the color of the aluminum nitride sintered body 10 may be uneven, and partial color staining may occur. On the other hand, when the content of titanium nitride is more than 5 wt %, the volume resistivity of the aluminum nitride sintered body 10 may increase. Therefore, the titanium nitride is preferably included in the aluminum nitride sintered body 10 at 1 wt % to 5 wt %.

FIG. 2 is a flowchart schematically showing a manufacturing process of an electrostatic chuck according to an embodiment of the present invention, FIG. 3 is a flowchart schematically showing a manufacturing process of the composite oxide powder in the manufacturing process of the electrostatic chuck of FIG. 2, and FIG. 4 is a graph showing an XRD analysis result of the composite oxide powder of FIG. 1.

FIGS. 2 and 3, a method of manufacturing an electrostatic chuck according to an embodiment of the present invention may comprise the steps of: preparing an aluminum nitride powder (S10); preparing a composite oxide powder including at least two kinds of rare earth metals (S20); mixing the aluminum nitride powder and the composite oxide powder to form a mixed powder (S30); performing a first press forming process for the mixed powder to produce a preform (S40); and performing a second press forming process and a sintering process for the preform (S50). Among these, any of the aluminum nitride powder and composite oxide powder may be formed first.

The aluminum nitride may be produced by a direct nitridation method, a reduction nitridation method, virtual synthesis method from alkyl aluminum, and the like.

The aluminum nitride powder may have a purity of 99.9% or more and an average particle size of about 1 μm, but is not limited thereto.

The step of forming the composite oxide powder (S20) may at least comprise the steps of: wet mixing a first rare earth metal oxide powder and a second rare earth metal oxide powder (S21); drying the mixed first and second rare earth metal oxides to form granules (S23); heat-treating the granules to synthesize a composite oxide (S25); and pulverizing the composite oxide (S27).

The first and second rare earth metals different from each other may be selected from lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Each of the first rare earth metal oxide powder and the second rare earth metal oxide powder may be a nano powder having a purity of 99.5% or more and an average particle size of 100 nm or less.

The first rare earth metal oxide powder and the second rare earth metal oxide powder may be mixed at 0.1 wt % to 10 wt %, respectively, with respect to the electrostatic chuck produced, and the first rare earth metal oxide powder and the second rare earth metal oxide powder may be mixed in various ratios.

The first rare earth metal oxide powder and the second rare earth metal oxide powder may be wet mixed using anhydrous methanol or anhydrous ethanol as a solvent. By way of embodiment, the first rare earth metal oxide powder and the second rare earth metal oxide powder may be uniformly mixed by a ball milling process using an alumina or nylon ball.

The wet mixed first and second rare earth metal oxides may form dried granules through a drying process. Drying may be carried out by spray drying, vacuum drying, etc., and the dried granules may be sized through sieving.

Then, the composite oxide is synthesized by heat treating the granules dried for 1 to 5 hours at a temperature of 500° C. to 1000° C. under a nitrogen atmosphere or an atmospheric pressure. By way of embodiment, the composite oxide may comprise at least any one of a europium-gadolinium composite oxide (EuGdOX), a samarium-gadolinium composite oxide (SmGdOX), a cerium-europium composite oxide (CeEuOX), a samarium-cerium composite oxide (SmCeOX), a gadolinium-samarium composite oxide (GdSmOx), and a lanthanum-cerium composite oxide (LaCeOX), which are clearly different from an oxide of any one of the first and second rare earth metals or a simple mixture of each oxide of the first and second rare earth metals, as can be clearly seen from FIG. 4.

FIG. 4 is a graph showing the XRD analysis results of the composite oxide and the single rare earth metal oxide, wherein A in FIG. 4 shows the XRD analysis result of a samarium (Sm) oxide as the single rare earth metal oxide, and B in FIG. 4 shows the XRD analysis result of the gadolinium-samarium composite oxide (GdSmOx) as the composite oxide.

As can be seen from B in FIG. 4, in the case of the gadolinium-samarium composite oxide (GdSmOx), that is, a composite oxide in which gadolinium is doped in samarium oxide, the peak of samarium has a shifted and broad form compared to A. In other words, as the composite oxide was formed, the peak position of the single oxide was shifted to the peak position of the composite oxide in the range of from 0.1 degree to 0.9 degree. This is because the crystal of samarium oxide is changed by a solid solution of gadolinium, whereby the composite oxide may have more lattice defects compared to a single oxide or a simple mixture of a single oxides, so that reactivity with oxygen may be improved.

The composite oxide synthesized through heat treatment as described above may be pulverized through a pulverization process to form a composite oxide powder. The average particle size of the composite oxide powder may be smaller than the average particle size of the aluminum nitride powder. For example, the average particle size of the composite oxide powder may be 100 nm or less.

After the aluminum nitride powder and the composite oxide powder are formed, they are mixed to form a mixed powder (S30).

By way of embodiment, the aluminum nitride powder and the composite oxide powder may be wet mixed with a binder, a plasticizer, and the like for formability to form a slurry, and then dried to form a mixed powder. By way of embodiment, the wet mixing may be carried out by a ball milling process using an alumina or nylon ball with a purity of 99% or more, and the drying of the slurry may be carried out by spray drying, vacuum drying, etc., but they are not limited thereto.

On the other hand, in the step of forming a mixed powder (S30), titanium dioxide may be further added. Titanium dioxide is for blackening of aluminum nitride sintered body and uniformity of color, and may be included in an amount of 0.1 wt % to 5 wt % based on the aluminum nitride sintered body. In addition, titanium dioxide may form titanium nitride while undergoing a sintering process, thereby further improving the electrical properties of the composite oxide 12.

Subsequently, the formed mixed powder is subjected to a first press forming process to produce a preform having a predetermined shape. By way of embodiment, after it is formed under a pressure of 150 bar or less by a oil-hydraulic press, the preform may be subjected to a cold hydrostatic forming to have a constant strength. In addition, the preform may be subjected to a nitrogen degassing within 60 hours at a temperature of 350° C. to 600° C.

Next, the preform is subjected to a second press forming process and a sintering process (S50) to form an aluminum nitride sintered body. By way of embodiment, in the second press forming process, the preform may be charged into a graphite mold and subjected to a second press forming process and a sintering process under a pressure of 300 bar or less and a temperature of 1650° C. to 1850° C. in a high-temperature pressurization sintering furnace. When the sintering temperature is lower than 1650° C. or higher than 1850° C., the volume resistivity of the aluminum nitride sintered body may be remarkably reduced.

The aluminum nitride sintered body thus formed may have a low volume resistivity.

More specifically, the composite oxide having high lattice defects, including two kinds of rare earth metals, may lower the resistance of aluminum nitride by effectively reacting with oxygen in aluminum nitride during the sintering process of the aluminum nitride sintered body, and may reduce the resistance of the aluminum nitride sintered body by forming a conductive crystal phase along the grain boundaries of aluminum nitride.

In this case, the composite oxide may be included in the aluminum nitride sintered body at 0.2 wt % to 20 wt %, so that the aluminum nitride sintered body may have a volume resistivity of $1 \times 10^8$ Ω·cm to $1 \times 10^{12}$ Ω·cm. Therefore, the electrostatic chuck according to the present invention, which is able to be made of the aluminum nitride sintered body, may have a high adsorption force and an excellent current response characteristic in which the time of chucking upon application of voltage and de-chucking upon removal of voltage is within 5 seconds.

In addition, since the composite oxide powder has a nano size, it is possible to improve the mechanical strength of the aluminum nitride sintered body, lower the sintering temperature during the manufacturing process of the aluminum nitride sintered body, reduce the amount of additives added in the formation of the mixed powder, and further improve the reactivity with oxygen. Thus, the composite oxide formed by such a composite oxide powder having a nano size may be referred to as a nanocomposite oxide.

FIG. 5 is a histogram showing a sintering temperature and a volume resistivity of an aluminum nitride sintered body according to the average particle size of the composite oxide powder of FIG. 1, and FIG. 6 is a photograph showing an oxygen distribution state of the aluminum nitride sintered body of FIG. 1.

FIG. 5 is a histogram showing the sintering temperature and the volume resistivity of the aluminum nitride sintered body according to the size of the composite oxide powder, wherein (I) to (IV) in FIG. 5 represent the aluminum nitride sintered bodies produced by mixing an aluminum nitride powder having a purity of 99.9% and an average particle size of 1 μm with a europium-gadolinium composite oxide (EuGdOX). However, there is a difference in that the aluminum nitride sintered bodies of (I) and (III) in FIG. 5 were produced by mixing a europium-gadolinium composite oxide (EuGdOX) powder having a particle size in μm, and the aluminum nitride sintered bodies of (II) and (IV) in FIG. 5 were produced by mixing a europium-gadolinium composite oxide (EuGdOX) powder having a particle size in nm. In addition, the aluminum nitride sintered bodies of (I) and (II) in FIG. 5 were sintered at 1850° C., and the aluminum nitride sintered bodies of (III) and (IV) in FIG. 5 were sintered at 1700° C.

As can be seen from FIG. 5, it can be seen that the aluminum nitride sintered bodies of (I) and (II) are formed to have a volume resistivity of $1 \times 10^{12}$ Ω·cm or less by a high sintering temperature. However, when the sintering temperature was lowered to 1700° C., it can be seen that the aluminum nitride sintered body of (III) has an increased volume resistivity of more than $1 \times 10^{14}$ Ω·cm, while the aluminum nitride sintered body of (IV) maintains a low volume resistivity. Therefore, as the composite oxide powder has a nano size, the sintering temperature of the aluminum nitride sintered bodies may be lowered, whereby the manufacturing process of the electrostatic chuck may be relatively easy.

FIG. 6 is a photograph showing an oxygen distribution state of the aluminum nitride sintered body comprising a samarium-cerium composite oxide (SmCeOX).

(A) in FIG. 6 represents a case where the samarium-cerium composite oxide (SmCeOX) powder has a particle size in nm, and (B) in FIG. 6 represents a case where the samarium-cerium composite oxide (SmCeOX) powder has a particle size in μm. As can be seen from FIG. 6, (B) in FIG. 6 shows an even distribution of oxygen, while (A) in FIG. 6 shows the aggregation phenomenon of oxygen around the samarium-cerium composite oxide (SmCeOX). That is, when the composite oxide is formed of a composite oxide powder having a nano size, it can be seen that the ability of the composite oxide to collect oxygen is improved.

Therefore, according to the present invention, as the composite oxide powder having an increased lattice defect has a nano size, the oxygen reactivity of the composite oxide is further improved to effectively remove oxygen in the aluminum nitride, and thus, the volume resistivity of the aluminum nitride sintered body may be lowered.

Hereinafter, the present invention will be described in more detail with reference to examples. The following examples are for the purpose of illustrating the invention in detail, and are not intended to limit the scope of the invention in any case.

EXAMPLES

Hereinafter, the present invention will be described in more detail with reference to examples. The following examples are for the purpose of illustrating the invention in detail, and are not intended to limit the scope of the invention in any case.

1. Preparation of Aluminum Nitride Powder and Composite Oxide Powder

The aluminum nitride powder is an aluminum nitride powder formed by a reduction nitridation method, and the aluminum nitride powder having a purity of 99.9% or more and the average particle diameter of 1 μm was used.

Rare earth metals were selected from gadolinium (Gd), samarium (Sm), cerium (Ce), and europium (Eu), and the content was adjusted to achieve a solid solution with each other. Oxides of each of gadolinium (Gd), samarium (Sm), cerium (Ce), and europium (Eu) have a purity of 99.5% or more and an average particle diameter of 100 nm or less.

The composite oxide powder was formed by wet mixing two different kinds of rare earth metal oxide powders with anhydrous methanol as a solvent through a ball milling process using an alumina ball having a purity of 99.9%, then drying them by a spray drying method, heat-treating them for 3 hours at a temperature of 800° C. under a nitrogen atmosphere, and pulverizing to have an average particle diameter of 100 nm or less.

2. Formation of Aluminum Nitride Sintered Body

1) A mixed powder was formed by wet mixing the aluminum nitride powder, the composite oxide powder, titanium dioxide, a binder, and a plasticizer with anhydrous methanol as a solvent through a ball milling process using an alumina ball having a purity of 99.9%, and then drying them by a spray drying method.

2) A preform was produced by forming the mixed powder under a pressure of 150 bar by a oil-hydraulic press, and the preform was subjected to a cold hydrostatic forming followed by a nitrogen degassing for 40 hours at a temperature of 450° C.

3) The preform was charged into a graphite mold, and subjected to a forming process and a sintering process under a pressure of 150 bar and a temperature of 1800° C. in a high-temperature pressurization sintering furnace to form a sintered aluminum nitride.

3. Measurement of Volume Resistivity on Aluminum Nitride Sintered Body

The measurement was made at room temperature under vacuum atmosphere. The volume resistivity of the aluminum nitride sintered bodies was calculated by setting the applied voltage to 500 V/mm and measuring the electric current at 1 minute after voltage application.

TABLE 2

| | Composition of Composite Oxide | Content of Composite Oxide and Titanium Dioxide | Volume Resistivity of Aluminum Nitride Sintered Body ($\Omega \cdot cm$) |
|---|---|---|---|
| Example 1 | 20GdCeOx | 2 wt % GDC + 2 wt % $TiO_2$ | $1.5 \times 10^{10}$ |
| Example 2 | 10GdCeOx | 2 wt % GDC + 2 wt % $TiO_2$ | $5.5 \times 10^{10}$ |
| Example 3 | 20SmCeOx | 1 wt % SDC + 3 wt % $TiO_2$ | $1.9 \times 10^{11}$ |
| Example 4 | EuGdOx | 3 wt % EDG + 2 wt % $TiO_2$ | $4.2 \times 10^{12}$ |
| Example 5 | 25CeSmOx | 10 wt % CDS + 3 wt % $TiO_2$ | $4.2 \times 10^{10}$ |
| Example 6 | GdSmOx | 6 wt % CDS + 3 wt % $TiO_2$ | $7.5 \times 10^{9}$ |
| Example 7 | 10GdCeOx | 10 wt % GDC + 3 wt % $TiO_2$ | $9.3 \times 10^{9}$ |
| Comparative Example 1 | SmCeOx | 2 wt % $Sm_2O_3$ + 2 wt % $CeO_2$ + 2 wt % $TiO_2$ | $5.1 \times 10^{11}$ |
| Comparative Example 2 | SmEuOx | 6 wt % $Sm_2O_3$ + 2 wt % $Eu_2O_3$ + 3 wt % $TiO_2$ | $1.0 \times 10^{15}$ |
| Comparative Example 3 | EuGdOx | 2 wt % $Eu_2O_3$ + 2 wt % $Gd_2O_3$ + 2 wt % $TiO_2$ | $3.5 \times 10^{14}$ |
| Comparative Example 4 | 20GdCeOx | 0.05 wt % GDC + 2 wt % $TiO_2$ | $9.0 \times 10^{14}$ |
| Comparative Example 5 | 20GdCeOx | 0.1 wt % GDC + 2 wt % $TiO_2$ | $7.1 \times 10^{14}$ |
| Comparative Example 6 | 20SmCeOx | 25 wt % SDC + 3 wt % $TiO_2$ | $6.5 \times 10^{7}$ |

As can be seen from comparative examples 1 to 3 and examples 1 to 7 in Table 2 above, it can be seen that the cases where the aluminum nitride sintered body comprises a composite oxide including two kinds of rare earth metals have a reduced volume resistivity compared to the cases where the aluminum nitride sintered body comprises each oxide of the two kinds of rare earth metals. At this time, as can be seen from comparative examples 4 to 6 in Table 2, since the volume resistivity of the aluminum nitride sintered body is too large or small when the content of the composite oxide in the aluminum nitride sintered body is outside 0.2 wt % to 20 wt %, the composite oxide may be included in the aluminum nitride sintered body at 0.2 wt % to 20 wt %.

Table 3 below represents the volume resistivity of the aluminum nitride sintered bodies according to the sintering temperature of the aluminum nitride sintered bodies.

TABLE 3

| | Content of Composite Oxide and Titanium Dioxide | Sintering Condition | Volume Resistivity of Aluminum Nitride Sintered Body ($\Omega \cdot cm$) |
|---|---|---|---|
| Example 1 | 2% GDC + 2% TiO$_2$ | 1710° C. 150 bar | $7.0 \times 10^9$ |
| Example 2 | | 1750° C. 150 bar | $2.5 \times 10^{10}$ |
| Example 3 | | 1800° C. 150 bar | $8.7 \times 10^{12}$ |
| Example 4 | | 1820° C. 150 bar | $4.3 \times 10^{11}$ |
| Example 5 | | 1850° C. 150 bar | $2.7 \times 10^{11}$ |
| Comparative Example 1 | | 1900° C. 150 bar | $2.5 \times 10^7$ |
| Comparative Example 2 | | 1600° C. 150 bar | $3.3 \times 10^7$ |

As can be seen from Table 3, based on 1750° C., when the sintering temperature is decreased to 1710° C., the volume resistivity tends to gradually decrease, whereas when the sintering temperature increases to 1800° C., the volume resistivity tends to gradually increase. In addition, it can be seen that the volume resistivity gradually decreases again at 1800° C. or more, whereas when the sintering temperature is more than 1850° C., the volume resistivity remarkably decreases due to oversintering. If the volume resistivity is less than $1 \times 10^8$ $\Omega \cdot cm$, leakage current may occur in the electrostatic chuck, and therefore, the sintering temperature is preferably set to 1850° C. or less. In addition, if the sintering temperature is less than 1650° C., a phenomenon in which the volume resistivity is remarkably reduced due to non-sintering appears similarly, and therefore, the sintering temperature is preferably set to 1650° C. or more.

Although the above description has been made with reference to the exemplary embodiments illustrated in the drawings, this is merely exemplary, and it will be understood by those skilled in the art that various modifications and equivalent other embodiments are possible therefrom. Therefore, the true technical protection scope of the present invention will be defined by the technical spirit of the appended claims.

The invention claimed is:

1. An electrostatic chuck made of an aluminum nitride sintered body,
wherein the aluminum nitride sintered body comprises aluminum nitride and a composite oxide formed along grain boundaries of the aluminum nitride,
wherein the composite oxide comprises at least two of rare earth metals which have a solid-solution relationship with each other,
wherein the composite oxide comprises a collection area having a higher oxygen content than a surrounding area, and
wherein the composite oxide is a nanocomposite oxide formed by a composite oxide powder having a nanometer-scale size.

2. The electrostatic chuck according to claim 1, wherein the composite oxide is included in the aluminum nitride sintered body at 0.2 wt % to 20 wt %.

3. The electrostatic chuck according to claim 1, wherein a volume resistivity of the aluminum nitride sintered body is $1 \times 10^8$ $\Omega \cdot cm$ to $1 \times 10^{12}$ $\Omega \cdot cm$.

4. The electrostatic chuck according to claim 1, wherein a crystal peak of the composite oxide is different from crystal peaks of oxides of each of the at least two rare earth metals.

5. The electrostatic chuck according to claim 1, wherein the aluminum nitride sintered body further comprises titanium nitride (TiN) at the grain boundaries of the aluminum nitride.

6. The electrostatic chuck according to claim 5, wherein the titanium nitride (TiN) is included in the aluminum nitride sintered body at 1 wt % to 5 wt %.

7. The electrostatic chuck according to claim 1, wherein the at least two rare earth metals are selected from lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu).

8. The electrostatic chuck according to claim 1, wherein the composite oxide comprises at least any one of a europium-gadolinium composite oxide (EuGdOX), a samarium-gadolinium composite oxide (SmGdOX), a cerium-europium composite oxide (CeEuOX), a samarium-cerium composite oxide (SmCeOX), a gadolinium-samarium composite oxide (GdSmOx), and a lanthanum-cerium composite oxide (LaCeOX).

* * * * *